(12) United States Patent
Yamano et al.

(10) Patent No.: US 8,482,985 B2
(45) Date of Patent: Jul. 9, 2013

(54) NONVOLATILE SEMICONDUCTOR STORAGE DEVICE

(75) Inventors: Ayako Yamano, Yokohama (JP); Osamu Nagao, Yokohama (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 13/315,516

(22) Filed: Dec. 9, 2011

(65) Prior Publication Data

US 2012/0243330 A1 Sep. 27, 2012

(30) Foreign Application Priority Data

Mar. 24, 2011 (JP) ................. P2011-066111

(51) Int. Cl.
*G11C 16/06* (2006.01)
(52) U.S. Cl.
USPC ............ 365/185.22; 365/185.33; 365/185.11; 365/185.29
(58) Field of Classification Search
USPC .............. 365/185.22, 185.33, 185.11, 185.29
See application file for complete search history.

(56) References Cited

U.S. PATENT DOCUMENTS

| | | | | |
|---|---|---|---|---|
| 7,864,583 B2* | 1/2011 | Surico et al. | ............. | 365/185.17 |
| 7,978,527 B2* | 7/2011 | Hemink et al. | ........... | 365/185.22 |
| 2007/0002620 A1* | 1/2007 | Fastow et al. | ............ | 365/185.11 |
| 2008/0239822 A1 | 10/2008 | Kosaki et al. | | |

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A nonvolatile semiconductor storage device according to an embodiment includes an erase circuit executing an erase sequence, wherein in the erase sequence, the erase circuit executes: an erase operation to change a selection memory cell group to an erased state, after the erase operation, a soft program operation on the selection memory cell group to solve over-erased state, and after the soft program operation, a first soft program verification operation performed on at least one partial selection memory cell group of a first partial selection memory cell group and a second partial selection memory cell group so as to confirm whether the partial selection memory cell group includes a predetermined number of memory cells or more that have threshold values equal to or more than a predetermined first threshold value, and after the first soft program verification operation.

20 Claims, 7 Drawing Sheets

NONVOLATILE SEMICONDUCTOR STORAGE DEVICE

CROSS-REFERENCE TO RELATED APPLICATIONS

This application is based upon and claims the benefit of priority from the prior Japanese Patent Application No. 2011-066111, filed on Mar. 24, 2011, the entire contents of which are incorporated herein by reference.

FIELD

Embodiments relate to a nonvolatile semiconductor storage device.

BACKGROUND

Complexity of control of nonvolatile semiconductor storage devices such as a NAND-type flash memory is increasing as the size decreases and higher-density integration is achieved. As a result, a cell current decreases due to reduction of the size of the transistor, and a resistance of a NAND string increases due to increase in the number of word lines per bit line, which affect operation after erasing operation.

Erase sequence performed on a memory cell includes, for example, (1) erase operation for changing threshold values of memory cells to erased state, (2) erase verification operation for confirming that the threshold values of the memory cells became equal to or less than the erased state in the erase operation, (3) soft program operation for solving over-erase of the memory cells in the erase operation, and (4) soft program verification operation for confirming whether the memory cells are over-written back in the soft program operation.

In order to reliably confirm that the soft program is done, so called intelligent soft program verification operation may be executed between the above operations (3) and (4) to confirm whether the memory cells are written back to such an extent that the memory cells do not attain written state as a result of the soft program operation.

However, when the intelligent soft program verification operation is executed, there is a problem in that it takes a longer processing time in the erase sequence.

DETAILED DESCRIPTION

A nonvolatile semiconductor storage device according to an embodiment includes a cell array including a plurality of first wirings, a second wiring, and a plurality of memory cells selected by the first wirings and the second wiring, and an erase circuit executing an erase sequence to erase data of the memory cells, wherein in the erase sequence, the erase circuit executes an erase operation to change, to an erased state, a selection memory cell group including a plurality of memory cells selected by the plurality of first wirings, after the erase operation, a soft program operation on the selection memory cell group to solve over-erased state, and after the soft program operation, a first soft program verification operation performed on at least one partial selection memory cell group of a first partial selection memory cell group, i.e., a portion of the selection memory cell group, and a second partial selection memory cell group, i.e., the other portion thereof, so as to confirm whether the partial selection memory cell group includes a predetermined number of memory cells or more that have threshold values equal to or more than a predetermined first threshold value, and after the first soft program verification operation.

A nonvolatile semiconductor storage device according to an embodiment will be hereinafter explained with reference to drawings.

[Structure of NAND Type Flash Memory]

Figure 1:
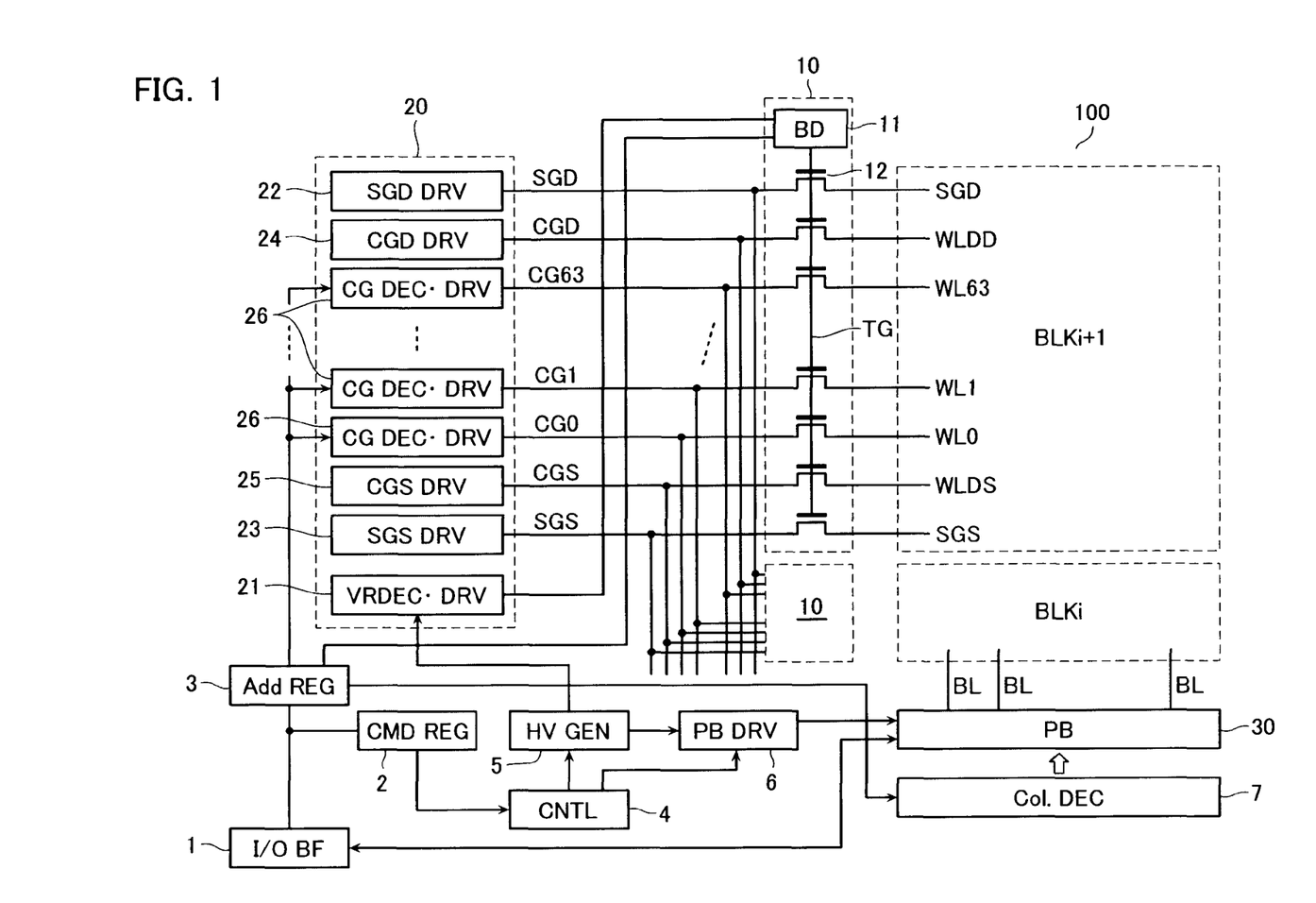
FIG. 1 is a figure illustrating a configuration of a NAND type flash memory according to an embodiment (nonvolatile semiconductor storage device)
Figure 2:
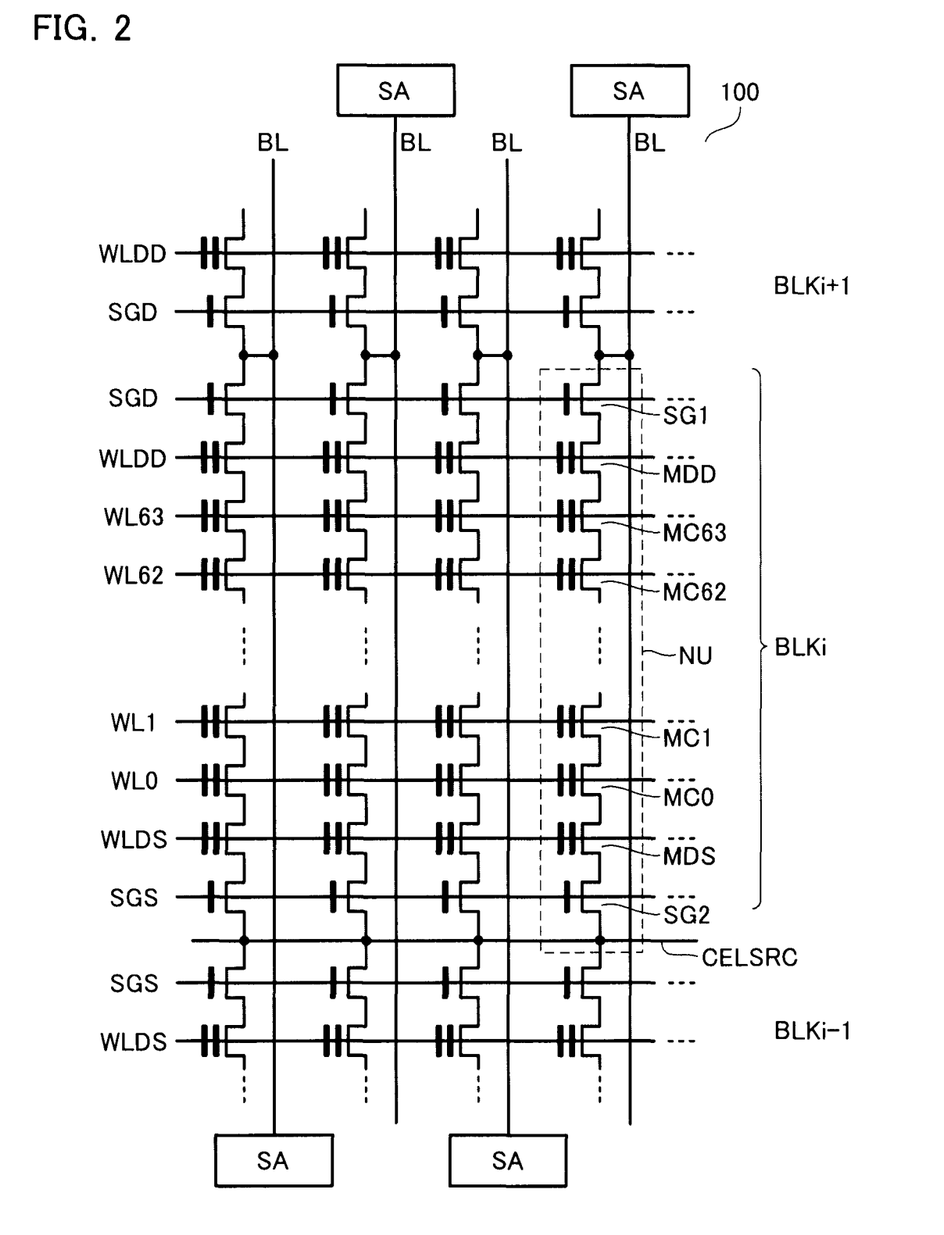
FIG. 2 is a figure illustrating a configuration of a cell array and a sense amplifier circuit of the NAND type flash memory.

FIG. 1 is an overview of the entire configuration of a NAND type flash memory according to an embodiment (nonvolatile semiconductor storage device). FIG. 2 is an equivalent circuit of the cell array 100. A NAND cell unit (NAND string) NU, i.e., a basic unit of the NAND type flash memory, includes a plurality of directly connected memory cells MC0 to MC63 and two selection transistors SG1, SG2 arranged at both ends thereof as a basic configuration.

In a case shown in FIGS. 1 and 2, dummy cells MDD, MDS that do not store any data are inserted adjacent to selection gate transistors SG1, SG2, respectively. These dummy cells MDD, MDS are configured in the same manner as the other memory cells MC0 to MC63 except that they cannot be accessed. In the explanation, a case will be explained where below these dummy cells MDD, MDS are provided. However, the same effects as the present embodiment can be obtained even when the dummy cells MDD, MDS are not provided.

One end of the NAND cell unit NU is connected to a bit line BL (second wiring) via the selection transistor SG1, and the other end thereof is connected to a common source line CELSRC (third wiring) within the memory array 100 via the selection transistor SG2.

One memory cell MC includes an N-type source/drain diffusion layer formed in a P-type well of a silicon substrate and has a laminated gate structure of a floating gate and a control gate as a charge accumulation layer. The quantity of electric charge held in this floating gate is changed in write operation and erase operation, whereby the threshold value of the memory cell is changed, so that one-bit data or multi-bit data are stored.

In the NAND cell unit NU, control gates of memory cells MC0 to MC63 and dummy cells MDD, MDS are connected to separate word lines WL0 to WL63 (first wirings) and dummy words WLDD, WLDS, and gates of selection gate transistors SG1, SG2 are connected to selection gate lines SGD, SGS, respectively.

A block BLK serving as a unit of data collective erase is constituted by a set of the NAND cell unit NU sharing the word lines WL0 to WL63, the dummy word lines WLDD, WLDS, and the selection gate lines SGD, SGS. Usually, as shown in the figure, a plurality of blocks BLKi, BLKi+1, . . . are arranged in the direction of the bit line BL.

In the NAND type flash memory, various kinds of operations are achieved with command inputs. For example, in write sequence, i.e., a series of processings for writing data to the memory cell, a data load command is latched from an I/O buffer 1 to a command register 2, and a write destination address is latched to an address register 3 via the I/O buffer 1. Subsequently, the write data is loaded to a sense amplifier circuit (page buffer) 30 via the I/O buffer 1. Thereafter, when the write execution command is latched via the I/O buffer 1 to the command register 2, the write sequence automatically starts therein.

That is, when the write execution command is input, a controller 4 starts the write sequence. In the write sequence, the controller 4 executes, e.g., control of a voltage needed in the write sequence, timing control of the write operation for applying a write pulse and write verification operation, and control for repeating write operation and write verification operation until a desired write sequence is finished. Likewise, when an erase execution command is input, the controller 4 executes control needed in an erase sequence as an erase circuit.

A high voltage generation circuit 5 is controlled by the controller 4 to generate not only a write voltage and a write pass voltage but also a high voltage (boosted voltage) needed in a word line/selection gate line driver 20 and a page buffer driver 6.

The word line/selection gate line driver 20 includes: the same number of CG decoder/drivers 26 as the number of word lines WL within the NAND cell unit NU for controlling the word line voltages; an SGD driver 22 for controlling the drain side selection gate line SGD; an SGS driver 23 for controlling the source side selection gate line SGS; CGD, CGS drivers 24, 25 for driving the dummy word lines WLDD, WLDS, respectively; and a VRDEC driver 21 for outputting a boosting power supply voltage VRDEC for the block decoder 11. These drivers 21 to 26 are shared by a plurality of blocks BLK of the cell array 100.

The NAND type flash memory needs to operate using a plurality of voltages for a plurality of word lines WL of a selected NAND cell unit NU. Therefore, a page address for selecting a word line WL within the NAND cell unit NU in a row address is input to the respective CG decoder/drivers 26.

A row decoder 10 in the narrow sense having a block selection function is arranged at the end portion of the word line WL of each block BLK of the cell array 100. The row decoder 10 includes a block decoder 11 for receiving a block address from the address register 3 and decoding the block address and a transfer transistor array 12 commonly controlled by the output of the block decoder 11 to transmit voltages needed for write, erase, and read operations to a selection gate line and a word line WL within the selection block. The block decoder 11 includes a level shift circuit for outputting a desired voltage to a common gate TG of the transfer transistor array 12.

Ends of the transfer transistor array 12 at one side are connected to the outputs of the drivers 21 to 26. Ends of the transfer transistor array 12 at the other side are connected to the word line WL, the dummy word lines WLDD, WLDS, and the selection gate line SGD and SGS within the cell array 100. For example, in the write operation, it is necessary to apply a write voltage Vpgm (about 20 V) to the selection word line WL. At this occasion, a voltage Vpgm+Vt (Vt is a voltage corresponding to a threshold value of the transfer transistor) supplied from the VRDEC driver 21 is applied to the common gate TG of the transfer transistor 12.

The NAND type flash memory uses an FN tunnel current for write and erase operations. In particular, in contrast to the NOR type flash memory, a current needed to shift the threshold value of one memory cell MC is so small that write operation can be performed on many memory cells MC at the same time in the write operation. Therefore, the page length of a collective processing unit of read and write operations can be set at a large value such as 2 KByte and 4 KByte. The same number of sense units SA as the page length are included in the sense amplifier circuit 30 constituting the page buffer.

For example, when write data are loaded, the column decoder 7 decodes a column address sent from the address register 3, connects the I/O buffer 1 and the selected sense unit SA, and sets write data to the sense amplifier circuit 30 for each column address. In read sequence, i.e., a series of processings for reading data from a memory cell, the order is opposite. That is, the data collectively are read to the page buffer 30, and the read data are output to the I/O buffer 1 from the selected sense unit SA according to the column address.

Although omitted in FIG. 1, a circuit for achieving input/output of data with a predetermined cycle is actually incorporated between the I/O buffer 1 and the page buffer 30.

[Data Allocation and Threshold Value State of the Memory Cell]

Figure 3:
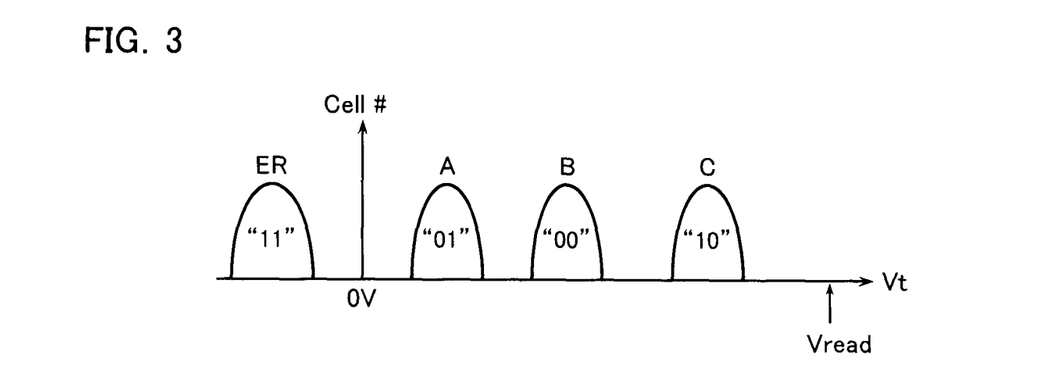
FIG. 3 is a figure illustrating a threshold value state of four-value storage in the NAND type flash memory.

FIG. 3 shows a relationship between data and threshold value state of the memory cell when a four-value data storage method is applied. In this example, two-bit data stored in one memory cell is allocated to two row addresses. In other words, a lower bit is data that may be read out when a lower page is selected. An upper bit is data that may be read out when an upper page is selected.

An erased state ER in which the threshold value is negative is data "11". Data "01", "00", "10" are respectively allocated to written states A, B, C of positive threshold values, which are arranged in the order of the threshold values.

[Write Method]

Figure 4:
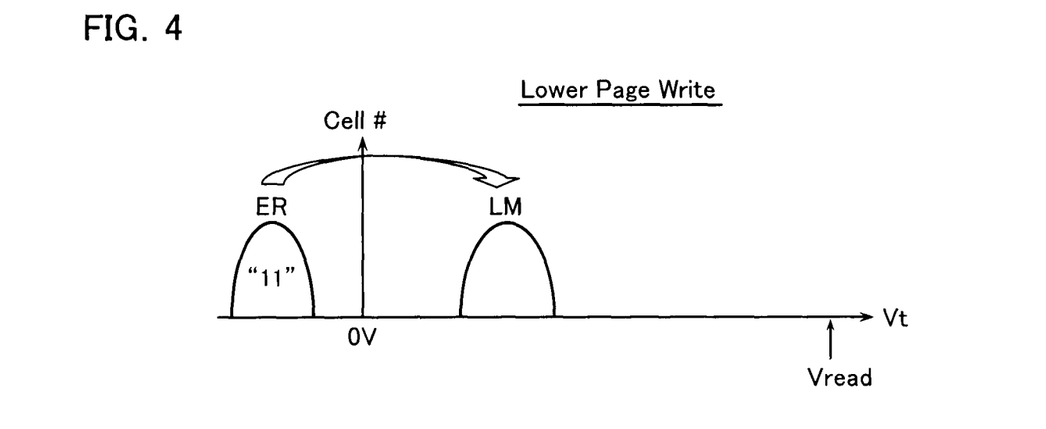
FIG. 4 a figure illustrating a data transition during lower page write process of the NAND type flash memory.
Figure 5:
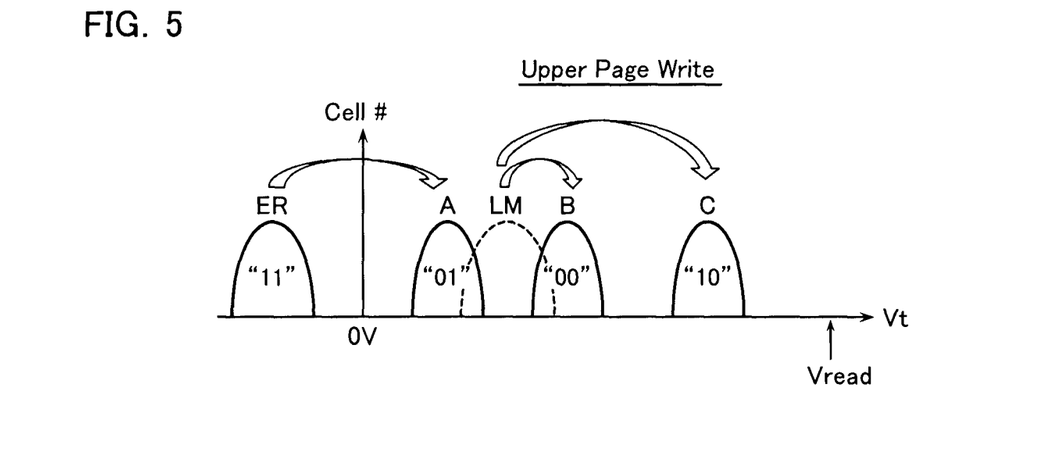
FIG. 5 is a figure illustrating a data transition during upper page write process of the NAND type flash memory.

Subsequently, FIGS. 4 and 5 show an example of write method in such data allocation method. FIG. 4 shows how a lower page is written. The lower page write process is executed based on the lower bit of data. When the lower bit is "1" (when data are "11" or "01"), the memory cell is maintained in the threshold value state ER. On the contrary, when the lower bit is "0" (when data are "00" or "10"), the memory cell is temporarily changed from the threshold value state ER to a threshold value state LM between a threshold value state A and a threshold value state B.

FIG. 5 shows how an upper page is written. The upper page write process is executed based on the upper bit of data. If the memory cell is in the threshold value state ER, and the upper bit is "1" (data are "11"), the memory cell is maintained in the threshold value state ER. On the contrary, when the upper bit is "0" (when data are "01"), the memory cell is changed from the erased state ER to the threshold value state A. On the contrary, when the memory cell is in the threshold value state LM, and the upper bit is "0" (data are "00"), the memory cell is changed from the threshold value state LM to the threshold value state B. On the contrary, when the upper bit is "1" (when data are "10"), the memory cell is changed from the threshold value state LM to the threshold value state C.

In this four-value data storage method, it is necessary to perform the lower page write process before the upper page write process.

The data write process is executed for every page after all the memory cells in the selection block are collectively erased. For example, word lines are selected in order from the word line WL0 close to the selection gate line SGD at the side of the source line CELSRC, and the write sequence is executed at the same time on all the memory cells included in one page.

[Erase Method]

Subsequently, an erase method for erasing data in a memory cell will be explained.

Erasing operation of data is generally achieved by the following sequence. First, erase operation is executed to discharge electrons from the floating gate of the memory cell and change the threshold value state of the memory cell to the erased state. Subsequently, erase verification operation is executed to confirm whether the threshold value state of the memory cell is changed to the erased state or not by the erase operation. The erase operation is repeatedly executed until this erase verification is passed. Subsequently, soft program operation is executed to write back the memory cell of which threshold value has become too deep due to the erase operation. Subsequently, intelligent soft program verification operation (referred to as first soft program verification operation, "ITSP verification operation") is executed to confirm that the threshold values of the memory cells are normally written back by the soft program operation. The soft program operation is repeatedly executed until this ITSP verification operation is passed. Subsequently, soft program verification operation (second soft program verification operation) is executed to confirm that the threshold values of the memory cells are not over-written back by the soft program operation. The erase operation, erase verification operation, the soft program operation, and the ITSP verification operation are repeatedly executed until this soft program verification operation is passed. Then, when the soft program verification operation is passed, the erase sequence is terminated.

In this case, the problem is that the word lines increase in each NAND cell unit due to the reduction of the size and that the cell current decreases. When the ON-resistance of the NAND cell unit increases and the cell current decreases during the verification operation (the erase verification operation, the ITSP verification operation, and the soft program verification operation), false reading occurs unless a sufficiently long bit line charge time is ensured.

Therefore, the even-numbered word line and the odd-numbered word line are alternately selected, and the verification operation is executed. In this case, the number of selection word lines is half as compared with a case where all the word lines are selected. Therefore, the ON-resistance of the NAND cell unit can be reduced, and the cell current can be ensured. As a result, even with the same charging time, chance of false reading can be reduced.

However, in this method, verification performed upon selecting the even-numbered word lines and verification performed upon selecting the odd-numbered word lines are needed for each verification operation, which increases the processing time of the erase sequence.

Therefore, in the present embodiment, during the ITSP verification operation, erase sequence is employed in which any one of the verification performed upon selecting the even-numbered word lines and the verification performed upon selecting the odd-numbered word lines is omitted.

Figure 6:
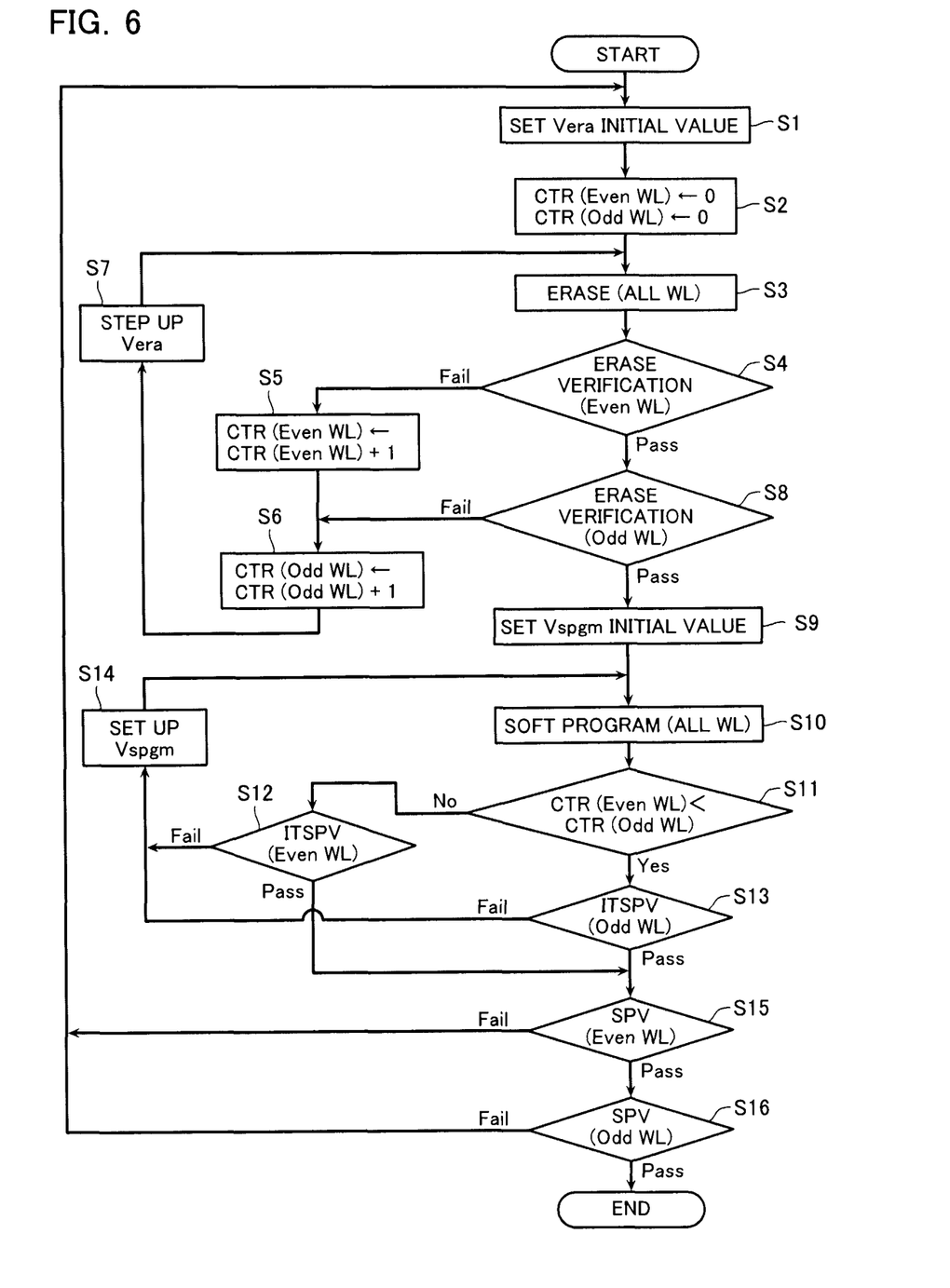
FIG. 6 is a figure illustrating erase sequence of the NAND type flash memory.

FIG. 6 is an erase sequence of the NAND type flash memory according to the present embodiment. In the explanation below, a set of memory cells selected when all the word lines of the selection block are selected is referred to as "selection memory cell group", a set of memory cells selected when the even-numbered word lines of the selection block are selected is referred to as "first partial selection memory cell group", and a set of memory cells selected when the odd-numbered word lines of the selection block are selected is referred to as "second partial selection memory cell group". In FIG. 6, the selection memory cell group, the first partial selection memory cell group, and the second partial selection memory cell group are respectively denoted as "All WLS", "Even WL", and "Odd WL". These expressions are also used in FIGS. 7 and 10 to 13. As explained above, the NAND type flash memory executing the ITSP verification operation on both of the first partial selection memory cell group and the second partial selection memory cell group in the erase sequence is referred to as "the NAND type flash memory according to the comparative example".

First, in step S1, the initial value of the erase voltage Vera applied to all the word lines in the erase operation is set.

Subsequently, in step S2, a counter CTR (Even WL) and a CTR (Odd WL) are reset. The counter CTR (Even WL) is a counter for holding the number of erase operations until all the memory cells in the first partial selection memory cell group pass the erase verification. Likewise, the counter CTR (Odd WL) is a counter for holding the number of erase operations until all the memory cells in the second partial selection memory cell group pass the erase verification. However, the counter CTR (Odd WL) is used only for the comparison with the counter CTR (Even WL) in step S11 explained later. Therefore, the counter CTR (Odd WL) holds only the value equal to or more than the value held in the counter (Even WL). For example, the counter CTR (Even WL) and the CTR (Odd WL) may be registers included in the controller 4.

Figure 7:
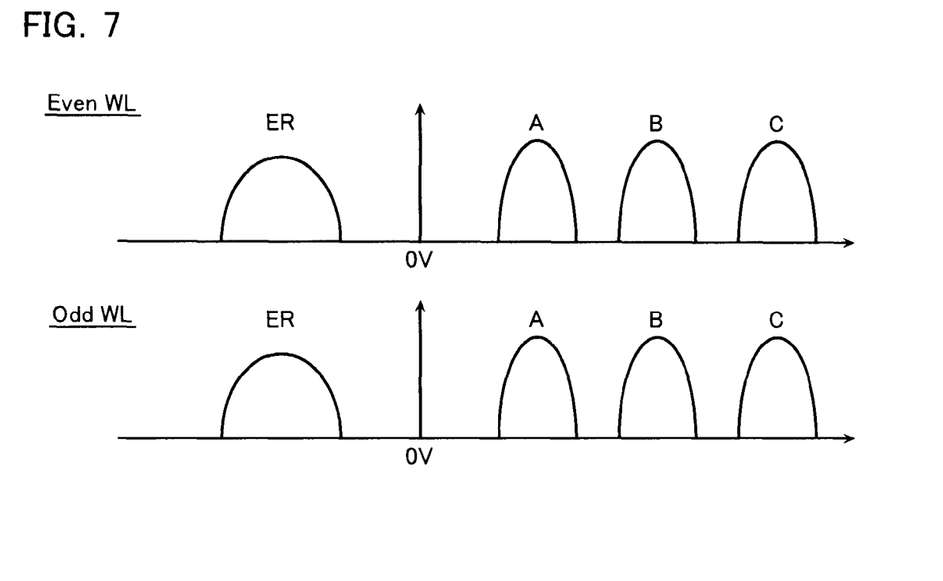
FIG. 7 is a figure illustrating data transition in the erase sequence as shown in FIG. 6.

The threshold value distributions of the first partial selection memory cell group and the second partial selection memory cell group in steps S1 and S2 are shown in FIG. 7.

Subsequently, in step S3, the erase operation is executed on the selection memory cell group. This erase operation is done in such a manner that all the word lines of the selection block are set at 0 V, and a positive boosted erase voltage Vera (=18 to 20 V) is applied to the P-type well formed with the cell array. As a result, a negative threshold value state (erased state) is obtained, in which electrons are discharged in the floating gate of all the memory cells of the selection memory cell group. In this erase operation, the lower limit value of the threshold value distribution is not controlled. Therefore, the selection memory cell group includes the memory cell in the over-erased state. In this erase operation, the lower limit of the threshold value distribution of the selection memory cell group is not controlled. Therefore, the threshold value distribution of the selection memory cell group is a threshold value distribution ER0 wider than the threshold value distribution ER in the ultimate erased state.

Subsequently, in step S4, the erase verification operation is performed on the first partial selection memory cell group. This erase verification operation is operation for confirming that the memory cell in the first partial selection memory cell group has changed to a negative threshold value voltage Vev (for example, −0.8 V).

Figure 8:
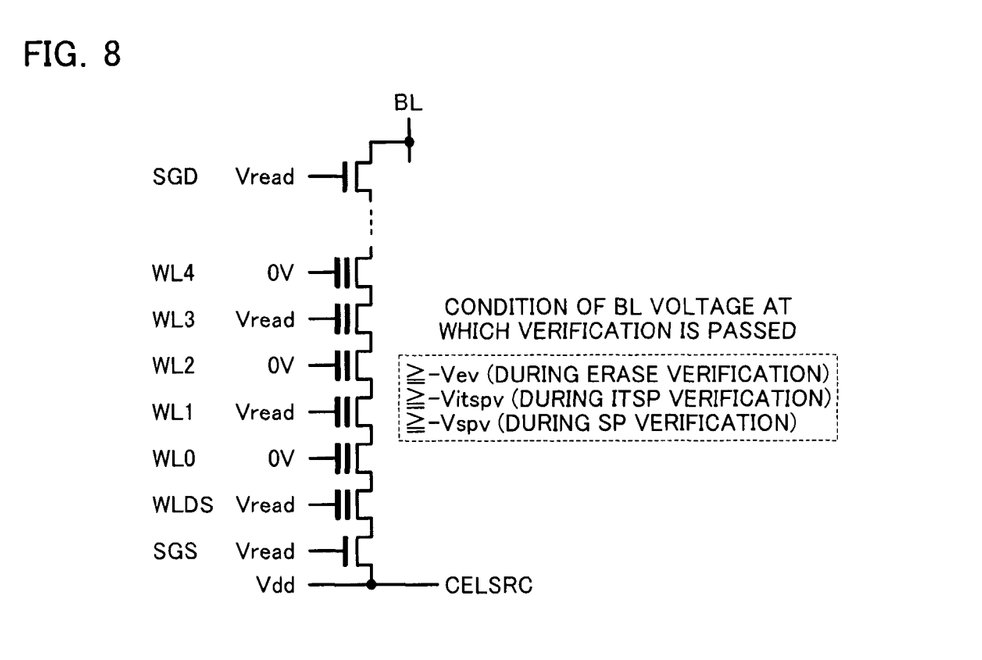
FIG. 8 is a figure illustrating bias state of a cell array during verification operation of the NAND type flash memory.

FIG. 8 is a figure illustrating bias state during erase verification operation performed on the first partial selection memory cell group. During the erase verification operation, the bit line BL is pre-charged to 0 V in advance, and as shown in FIG. 8, a read voltage Vread is given to the odd-numbered word lines WL1, WL3, . . . , and the dummy word lines WLDS and WLDD, and 0 V is given to the even-numbered word lines WL0, WL2, . . . . Then, a cell current is passed from the source line CELSRC to the bit line BL side, and detection is made as to whether the bit line BL is charged to the voltage −Vev (for example, 0.8 V). When the bit line BL is charged to the voltage −Vev, the threshold values of all the memory cells in the first partial selection memory cell group are equal to or less than the voltage Vev. Therefore, this means that the first partial selection memory cell group has passed the erase verification.

On the other hand, when the first partial selection memory cell group does not pass the erase verification, the counter CTR (Even WL) is increased in step S5 and the counter CTR (Odd WL) is increased in step S6. Thereafter, in step S7, the erase voltage Vera is stepped up, and the processing of step S3 is subsequently performed again.

Subsequently, in step S8, the erase verification operation is performed on the second partial selection memory cell group. This erase verification operation is operation for confirming that the memory cell in the second partial selection memory cell group has changed to a negative threshold value voltage Vev (for example, −0.8 V).

Figure 9:
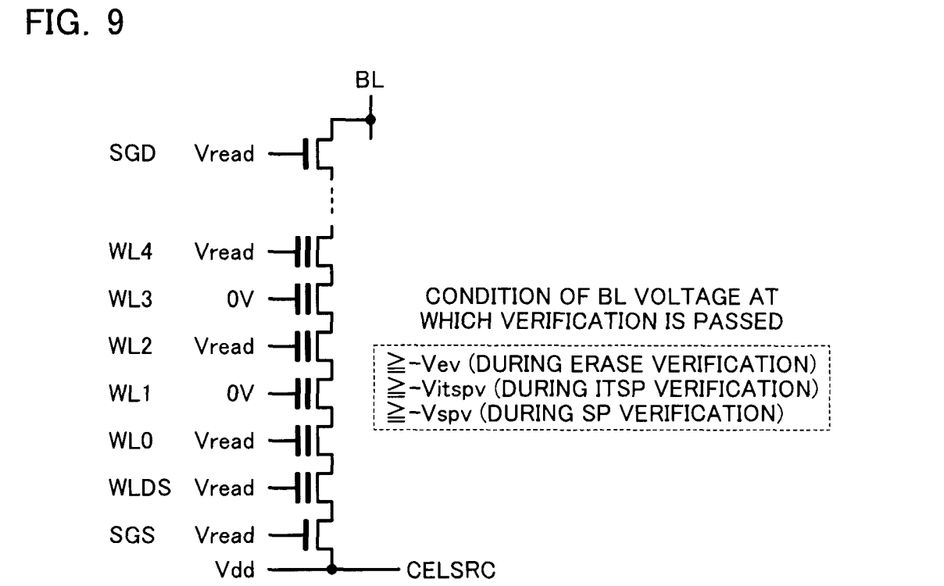
FIG. 9 is a figure illustrating a bias state of a cell array during verification operation of the NAND type flash memory.

FIG. 9 is a figure illustrating bias state during erase verification operation performed on the second partial selection memory cell group. During the erase verification operation, the bit line BL is pre-charged to 0 V in advance, and as shown in FIG. 9, the read voltage Vread is given to the even-numbered word lines WL0, WL2, . . . , and the dummy word lines WLDS and WLDD, and 0 V is given to the odd-numbered word lines WL1, WL3, . . . . Then, a cell current is passed from the source line CELSRC to the bit line BL side, and detection is made as to whether the bit line BL is charged to the voltage −Vev (for example, 0.8 V). When the bit line BL is charged to the voltage −Vev, the threshold values of all the memory cells in the second partial selection memory cell group are equal to or less than the voltage Vev. Therefore, this means that the second partial selection memory cell group has passed the erase verification.

On the other hand, when the second partial selection memory cell group does not pass the erase verification, the counter CTR (Odd WL) is increased in step S6. Thereafter, in step S7, the erase voltage Vera is stepped up, and the processing of step S3 is subsequently performed again.

Figure 10:
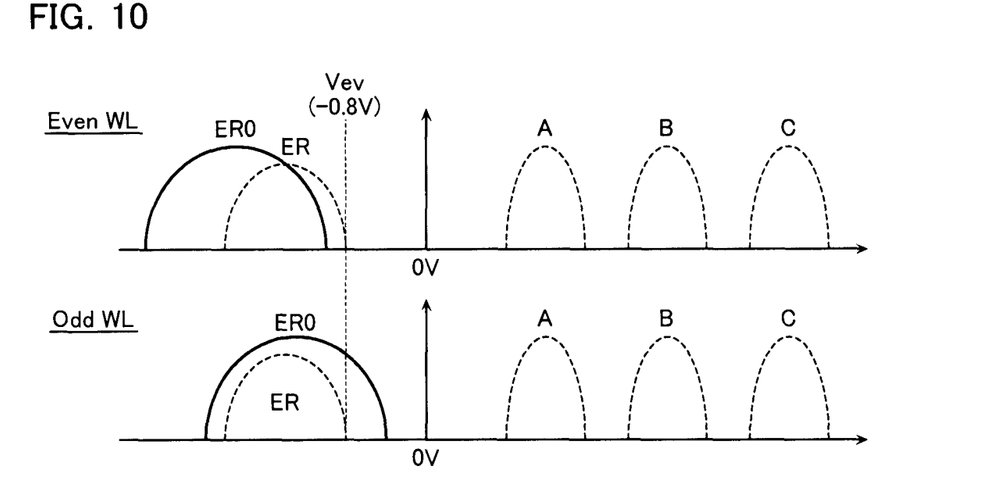
FIG. 10 is a figure illustrating data transition in the erase sequence as shown in FIG. 6.

For example, after the first erase operation (step S3) is finished, it is assumed that the threshold value distribution ER0 of the first partial selection memory cell group and the second partial selection memory cell group is obtained as shown in FIG. 10. In this case, the upper limit of the threshold value distribution of the first partial selection memory cell group is equal to or less than the voltage Vev, and accordingly, the first partial selection memory cell group passes the erase verification (step S4). As a result, the counter CTR (Even WL) is still zero. On the other hand, since the upper limit of the threshold value distribution in the second partial selection memory cell group exceeds the voltage Vev, the second partial selection memory cell group does not pass the erase verification (step S6). As a result, the counter CTR (Odd WL) is increased to be 1 (step S7).

Figure 11:
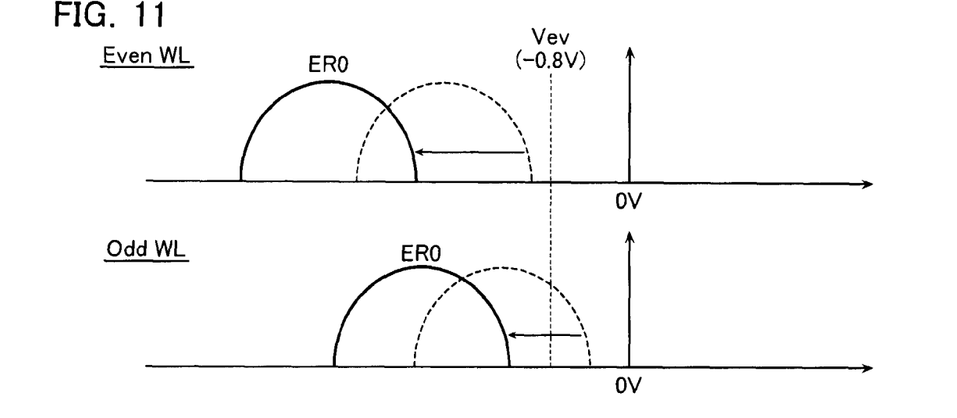
FIG. 11 is a figure illustrating data transition in the erase sequence as shown in FIG. 6.

Further, since the second partial selection memory cell group has not passed the erase verification, the erase voltage Vera is stepped-up (step S7), and thereafter, the second erase operation is executed (step S3). For example, after the second erase operation is finished, it is assumed that the threshold value distribution ER0 of the first partial selection memory cell group and the second partial selection memory cell group is obtained as shown in FIG. 11. In the case of FIG. 11, not only the threshold value distribution in the first partial selection memory cell group but also the threshold value distribution of the second partial selection memory cell group change to a voltage equal to or less than the voltage Vev. Therefore, both of them pass the erase verification.

Therefore, in the case of the example as shown in FIGS. 10 and 11, the ultimate values of the counters CTR (Even WL), CTR (Odd WL) are 0, 1, respectively. When the value of the counter CTR (Odd WL) is more than the value of the counter CTR (Even WL) as described above, this means that the erase speed of the first partial selection memory cell group is slower than the erase speed of the first portion partial selection memory cell group. On the other hand, when the value of the counter CTR (Odd WL) is the same as the value of the counter CTR (Even WL), this means that the erase speed of the first partial selection memory cell group is about the same or slower than the erase speed of the second partial selection memory cell group.

When both of the erase verifications in steps S4 and S8 are passed, the initial value of the write voltage Vspgm used for the soft program operation for solving the over-erased state is set in step S9 subsequent thereto.

In the above explanation, the erase verification in steps S4 and S8 is configured to be passed on condition that all the threshold values of the memory cells included in the first partial selection memory cell group or the second partial selection memory cell group are equal to or less than the voltage Vev. Alternatively, an allowable number of failures may be set in advance, and the erase verification may be passed on condition that the number of memory cells whose threshold values have not attained values equal to or less than the voltage Vev is equal to or less than the allowable number of failures.

Subsequently, in step S10, the soft program operation is performed on the selection memory cell group. The soft program operation is executed as operation for giving the write voltage Vspgm to all the word lines of the selection block and injecting electrons to the floating gates of all the memory cells of the selection memory cell group.

Subsequently, in step S11, the value of the counter CTR (Even WL) and the value of the counter CTR (Odd WL) are compared. As a result, when the value of the counter CTR (Even WL) is the same as the value of the counter CTR (Odd WL), i.e., when the erase speed of the first partial selection memory cell group is about the same as or slower than the erase speed of the second partial selection memory cell group, the ITSP verification operation (denoted as "ITSPV" in FIG. 6) is executed on the first partial selection memory cell group (step S12), and the ITSP verification operation is not executed on the second partial selection memory cell group. On the other hand, when the value of the counter CTR (Odd WL) is more than the value of the counter (Even WL), i.e., when the erase speed of the second partial selection memory cell group is slower than the erase speed of the first partial selection memory cell group, the ITSP verification operation is executed on the second partial selection memory cell group (step S13), and the ITSP verification operation is not executed on the first partial selection memory cell group.

In the erase sequence as shown in FIG. 6, when the erase speed of the first partial selection memory cell group and the erase speed of the second partial selection memory cell group are about the same, the ITSP verification operation is executed on the first partial selection memory cell group. On the contrary, the ITSP verification operation may be executed on the second partial selection memory cell group, so that the same effects can be obtained. However, in this case, it should be noted that this is executed in the erase sequence in which "(Even WL)" and "(Odd WL)" are alternately switched as shown in FIG. 6.

The ITSP verification operation as shown in step S12 is operation for confirming that the number of NAND cell units in which the cell current does not flow and the bit line BL is not charged to the voltage −Vitspv (Vitspv is, for example, 0.8 V) as a result of the bias state as shown in FIG. 8 is more than a predetermined number.

On the other hand, the ITSP verification operation as shown in step S13 is operation for confirming that the number of NAND cell units in which the cell current does not flow and the bit line BL is not charged to the voltage −Vitspv (Vitspv, i.e., first threshold value, is, for example, 0.8 V) as a result of the bias state as shown in FIG. 9 is more than a predetermined number.

When the ITSP verification in steps S12 or S13 is not passed, the write voltage Vspgm is stepped up (step S14), and thereafter, the processing of step S10 is performed again.

On the other hand, when the ITSP verification in step S12 or S13 is passed, the soft program operation is terminated because further soft program operation may over-write back the threshold value of the memory cell.

Figure 12:
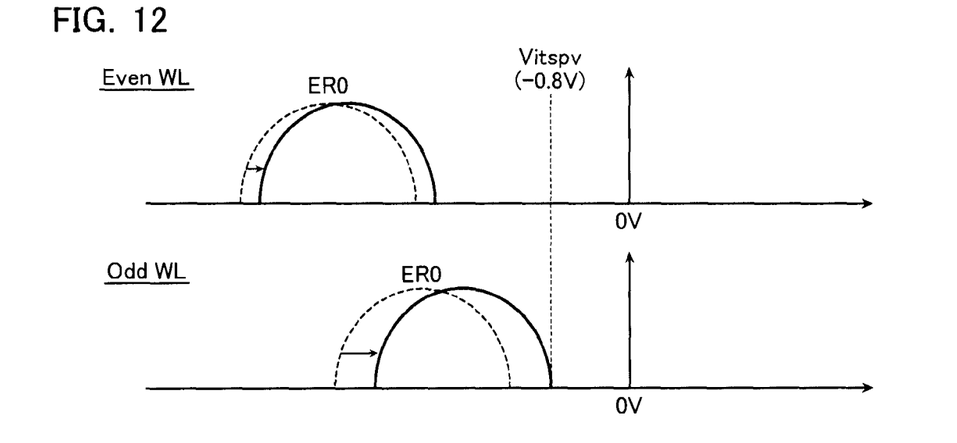
FIG. 12 is a figure illustrating data transition in the erase sequence as shown in FIG. 6.

For example, after the first soft program operation (step S10) is finished, it is assumed that the threshold value distribution ER0 of the first partial selection memory cell group and the second partial selection memory cell group is obtained as shown in FIG. 12. When the example explained with reference to FIGS. 10 and 11 is assumed, the target of the ITSP verification operation is the second partial selection memory cell group (steps S11 and S13). In this case, the upper limit of the threshold value of the memory cell distribution ER0 in the second partial selection memory cell group does not reach the voltage Vitpsv (for example, −0.8 V), and naturally, the ITSP verification is not passed.

Figure 13:
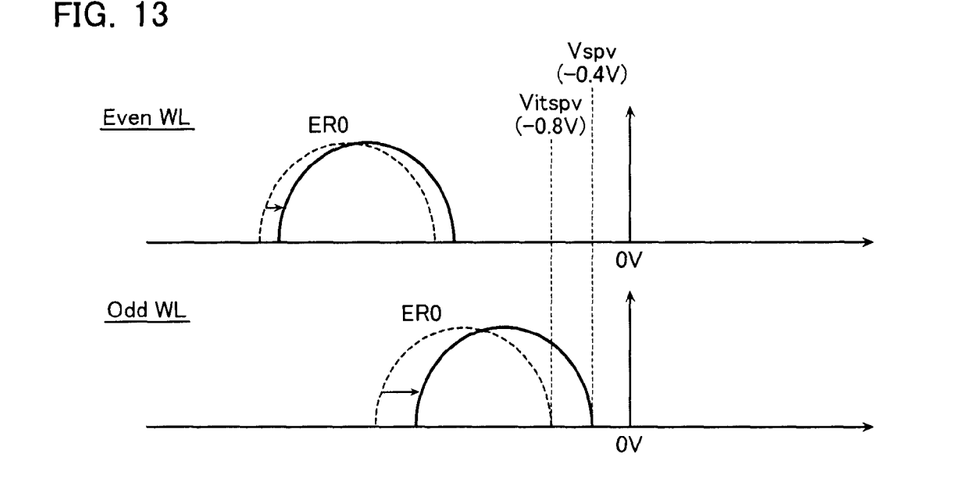
FIG. 13 is a figure illustrating data transition in the erase sequence as shown in FIG. 6.

Further, since the second partial selection memory cell group does not pass the ITSP verification, the write voltage Vspgm is stepped up (step S14), and thereafter the second soft program operation is executed on the selection memory cell group (step S10). As a result, it is assumed that the number of NAND cell units in which the cell current does not flow and the bit line BL is not charged to the voltage −Vitspv is more than the predetermined number. In this case, it is considered that the threshold value distribution ER0 of the first partial selection memory cell group and the second partial selection memory cell group has become as shown in FIG. 13. In other words, it is considered that the upper limit of the threshold value distribution of the second partial selection memory cell group is appropriately more than the voltage Vitspv, the ITSP verification can be passed.

In this case, the reason why a partial selection memory cell group of slow erase speed is selected in step S11 will be mentioned. When the erase speed is slow, the overall intermediate threshold value of the memory cells included in the partial selection memory cell group is high, and accordingly, it is considered that the write speed is high. Therefore, the threshold value distribution of the partial selection memory cell group of which erase speed is slow is written back by soft program faster than the threshold value distribution of the partial selection memory cell group of which erase speed is fast. In this case, when the ITSP verification operation is executed on the partial selection memory cell group of which erase speed is slow, the threshold values of the memory cells of the entire selection memory cell groups including the partial selection memory cell group of which erase speed is fast are not over-written back. In other words, when excessive soft program operation is to be avoided, it can be said that it is sufficient to execute the ITSP verification operation on the partial selection memory cell group of which erase speed is slow. The ITSP verification operation according to the present embodiment uses the characteristics of the intermediate threshold value of the memory cell. Therefore, as compared with the ITSP verification operation according to the comparative example in which a lower tail of the threshold value distribution is verified by checking an upper tail of threshold value distributions of both of a first partial selection memory cell group and a second partial selection memory cell group, the accuracy of the ITSP verification operation according to the present embodiment is not inferior.

As described above, in the present embodiment, the ITSP verification operation for one of the partial selection memory cell groups, i.e., the first partial selection memory cell group and the second partial selection memory cell group, of which erase speed is fast is omitted. Therefore, the processing time of the ITSP verification operation can be reduced to about half the processing time of the NAND flash memory according to the comparative example. Even in such case, excessive soft program can be avoided due to the reason described above.

When the ITSP verification is passed, a verification voltage Vspv (second threshold value) (for example, −0.4 V) a little bit higher than the verification voltage Vitspv during the above ITSP verification operation is set in step S15 subsequent thereto, and the soft program verification operation (denoted as "SPV" in FIG. 6) is executed to confirm that the threshold values of all the memory cells in the first partial selection memory cell group are equal to or less than the voltage Vspv. As a result, when the first partial selection memory cell group passes the soft program verification, the soft program verification operation is executed on the second partial selection memory cell group in step S16 subsequent thereto.

The soft program verification operation is the same as the erase verification operation except that the verification voltage is the voltage Vspv (for example, −0.4 V) as shown in FIGS. 8 and 9. When both of the first partial selection memory cell group and the second partial selection memory cell group pass the soft program verification, it is confirmed that the threshold values of all the memory cells in the selection memory cell group are equal to or less than the voltage −Vspv, and are not over-written back by the soft program operation. Therefore, the erase sequence is terminated.

On the other hand, when at least one of the first partial selection memory cell group and the second partial selection memory cell group does not pass the soft program verification, the erase operation of step S1 is executed all over again.

[Summary]

According to the embodiment explained above, in the erase sequence, the ITSP verification operation is executed on at least one of the first partial selection memory cell group and the second partial selection memory cell group, and the ITSP verification operation is executed on the other of them. Therefore, the processing time of the erase sequence can be reduced to a time less than the processing time of the NAND type flash memory according to the comparative example. Even in this case, the partial selection memory cell group of which erase speed is slow is selected as the target of the ITSP verification operation, and therefore, the effects of the ITSP verification operation can be obtained at about the same level as that of the NAND type flash memory according to the comparative example.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device comprising:
a cell array including a plurality of first wirings, a second wiring, and a plurality of memory cells selected by the first wirings and the second wiring; and
an erase circuit executing an erase sequence to erase data of the memory cells,
in the erase sequence, the erase circuit executing:
an erase operation to change, to an erased state, a selection memory cell group including a plurality of memory cells selected by the plurality of first wirings;
after the erase operation, a soft program operation on the selection memory cell group to solve over-erased state;
after the soft program operation, a first soft program verification operation performed on at least one partial selection memory cell group of a first partial selection memory cell group, i.e., a portion of the selection memory cell group, and a second partial selection memory cell group, i.e., the other portion thereof, so as to confirm whether the partial selection memory cell group includes a predetermined number of memory cells or more that have threshold values equal to or more than a predetermined first threshold value; and
after the first soft program verification operation, a second soft program verification operation to confirm that the threshold values of the memory cells in the selection memory cell group are less than a predetermined second threshold value that is higher than the first threshold value.

2. The nonvolatile semiconductor storage device according to claim 1, wherein the partial selection memory cell group on which the first soft program operation is executed is one of the first partial selection memory cell group and the second partial selection memory cell group of which transition speed to the erased state is slower in whole.

3. The nonvolatile semiconductor storage device according to claim 1, wherein the partial selection memory cell group on which the first soft program operation is executed is one of the first partial selection memory cell group and the second partial selection memory cell group of which write speed is faster in whole.

4. The nonvolatile semiconductor storage device according to claim 1, wherein the first partial selection memory cell group includes a plurality of memory cells in the selection memory cell group that are selected by even-numbered first wirings, and the second partial selection memory cell group includes a plurality of memory cells in the selection memory cell group that are selected by odd-numbered first wirings.

5. The nonvolatile semiconductor storage device according to claim 1, wherein after the selection memory cell group is changed to the erased state but before the soft program operation is executed, the erase circuit executes an erase verification operation to confirm that the threshold values of the memory cells in the selection memory cell group are less than a threshold value indicating the erased state.

6. The nonvolatile semiconductor storage device according to claim 1, wherein the erase circuit repeatedly executes the erase operation until the erase verification operation is passed, and the partial selection memory cell group on which the first soft program operation is executed is one of the first partial selection memory cell group and the second partial selection memory cell group that has a larger repeating number for which the erase operation is repeated until the erase verification is passed.

7. The nonvolatile semiconductor storage device according to claim 1, wherein the erase circuit repeatedly executes the erase operation until the erase verification operation is passed, and when a number of erase operations that are performed until the first partial selection memory cell group passes the erase verification operation is equal to or more than a number of erase operations that are performed until the second partial selection memory cell group passes the erase verification operation, the first soft program operation is executed on the first partial selection memory cell group, and in the other case, the first soft program operation is executed on the second partial selection memory cell group.

8. A nonvolatile semiconductor storage device comprising:
a cell array including a plurality of first wirings, a second wiring, and a plurality of memory cells selected by the first wirings and the second wiring; and
an erase circuit executing an erase sequence to erase data of the memory cells,
in the erase sequence, the erase circuit executing:
an erase operation to change, to an erased state, a selection memory cell group including a plurality of memory cells selected by the plurality of first wirings;
after the erase operation, a soft program operation on the selection memory cell group to solve over-erased state; and
after the soft program operation, a first soft program verification operation performed on at least one partial selection memory cell group of a first partial selection memory cell group, i.e., a portion of the selection memory cell group, and a second partial selection memory cell group, i.e., the other portion thereof, so as to confirm whether the partial selection memory cell group includes a predetermined number of memory cells or more that have threshold values equal to or more than a predetermined first threshold value; and after the first soft program verification operation.

9. The nonvolatile semiconductor storage device according to claim 8, wherein the partial selection memory cell group on which the first soft program operation is executed is one of the first partial selection memory cell group and the second partial selection memory cell group of which transition speed to the erased state is slower in whole.

10. The nonvolatile semiconductor storage device according to claim 8, wherein the partial selection memory cell group on which the first soft program operation is executed is one of the first partial selection memory cell group and the second partial selection memory cell group of which write speed is faster in whole.

11. The nonvolatile semiconductor storage device according to claim 8, wherein the first partial selection memory cell group includes a plurality of memory cells in the selection memory cell group that are selected by even-numbered first wirings, and the second partial selection memory cell group includes a plurality of memory cells in the selection memory cell group that are selected by odd-numbered first wirings.

12. The nonvolatile semiconductor storage device according to claim 8, wherein after the selection memory cell group is changed to the erased state but before the soft program operation is executed, the erase circuit executes an erase verification operation to confirm that the threshold values of the memory cells in the selection memory cell group are less than a threshold value indicating the erased state.

13. The nonvolatile semiconductor storage device according to claim 8, wherein the erase circuit repeatedly executes the erase operation until the erase verification operation is passed, and the partial selection memory cell group on which the first soft program operation is executed is one of the first partial selection memory cell group and the second partial selection memory cell group that has a larger repeating number for which the erase operation is repeated until the erase verification is passed.

14. The nonvolatile semiconductor storage device according to claim 8, wherein the erase circuit repeatedly executes the erase operation until the erase verification operation is passed, and when a number of erase operations that are performed until the first partial selection memory cell group passes the erase verification operation is equal to or more than a number of erase operations that are performed until the second partial selection memory cell group passes the erase verification operation, the first soft program operation is executed on the first partial selection memory cell group, and in the other case, the first soft program operation is executed on the second partial selection memory cell group.

15. A nonvolatile semiconductor storage device comprising:
a cell array including a plurality of first wirings, a second wiring, a third wiring, and a cell unit provided between the second wiring and the third wiring and including a plurality of memory cells connected in series, the first wirings being respectively connected to the memory cells; and
an erase circuit executing an erase sequence to erase data of the memory cells,
in the erase sequence, the erase circuit executing:
an erase operation to change, to an erased state, a selection memory cell group including a plurality of memory cells selected by the plurality of first wirings;
after the erase operation, a soft program operation on the selection memory cell group to solve over-erased state;
after the soft program operation, a first soft program verification operation performed on at least one partial selection memory cell group of a first partial selection memory cell group, i.e., a portion of the selection memory cell group, and a second partial selection memory cell group, i.e., the other portion thereof, so as to confirm whether the partial selection memory cell group includes a predetermined number of memory cells or more that have threshold values equal to or more than a predetermined first threshold value; and
after the first soft program verification operation, a second soft program verification operation to confirm that the threshold values of the memory cells in the selection memory cell group are less than a predetermined second threshold value that is higher than the first threshold value.

16. The nonvolatile semiconductor storage device according to claim 15, wherein the partial selection memory cell group on which the first soft program operation is executed is one of the first partial selection memory cell group and the second partial selection memory cell group of which transition speed to the erased state is slower in whole.

17. The nonvolatile semiconductor storage device according to claim 15, wherein the partial selection memory cell group on which the first soft program operation is executed is one of the first partial selection memory cell group and the second partial selection memory cell group of which write speed is faster in whole.

18. The nonvolatile semiconductor storage device according to claim 15, wherein the first partial selection memory cell group includes a plurality of memory cells in the selection memory cell group that are selected by even-numbered first wirings, and the second partial selection memory cell group includes a plurality of memory cells in the selection memory cell group that are selected by odd-numbered first wirings.

19. The nonvolatile semiconductor storage device according to claim 15, wherein after the selection memory cell group is changed to the erased state but before the soft program operation is executed, the erase circuit executes an erase verification operation to confirm that the threshold values of the memory cells in the selection memory cell group are less than a threshold value indicating the erased state.

20. The nonvolatile semiconductor storage device according to claim 15, wherein the erase circuit repeatedly executes the erase operation until the erase verification operation is passed, and the partial selection memory cell group on which the first soft program operation is executed is one of the first partial selection memory cell group and the second partial selection memory cell group that has a larger repeating number for which the erase operation is repeated until the erase verification is passed.

* * * * *